(12) United States Patent
Wu et al.

(10) Patent No.: US 12,094,832 B2
(45) Date of Patent: Sep. 17, 2024

(54) STRETCHABLE ELECTRONIC DEVICE

(71) Applicant: InnoLux Corporation, Miao-Li County (TW)

(72) Inventors: Yuan-Lin Wu, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/103,463

(22) Filed: Jan. 30, 2023

(65) Prior Publication Data
US 2023/0170308 A1    Jun. 1, 2023

Related U.S. Application Data

(60) Continuation of application No. 17/243,504, filed on Apr. 28, 2021, now Pat. No. 11,587,880, which is a division of application No. 16/425,922, filed on May 29, 2019, now Pat. No. 11,024,584.

(51) Int. Cl.
| | |
|---|---|
| H01L 23/538 | (2006.01) |
| H01L 23/498 | (2006.01) |
| H01L 25/16 | (2023.01) |
| H01L 33/52 | (2010.01) |

(52) U.S. Cl.
CPC .... H01L 23/5387 (2013.01); H01L 23/49811 (2013.01); H01L 25/167 (2013.01); H01L 33/52 (2013.01)

(58) Field of Classification Search
CPC .......... H01L 23/49811; H01L 23/5387; H01L 25/0753; H01L 25/167; H01L 33/52; H01L 33/62; G09F 9/301; G09F 9/33
USPC .............................................. 257/89
See application file for complete search history.

(56) References Cited

U.S. PATENT DOCUMENTS

| | | | |
|---|---|---|---|
| 2019/0081273 A1* | 3/2019 | Sung | ....................... H10K 50/80 |
| 2020/0119294 A1* | 4/2020 | Kim | ..................... H10K 59/131 |

FOREIGN PATENT DOCUMENTS

CN        109390359     * 10/2018

* cited by examiner

*Primary Examiner* — Fazli Erdem
(74) *Attorney, Agent, or Firm* — Winston Hsu

(57) ABSTRACT

An electronic device stretchable from a first state to a second state includes a substrate, a plurality of light emitting groups, and a plurality of signal pads. The substrate has a first region and a second region. The light emitting groups are disposed on the first region. The signal pads are disposed on the second region. When the electronic device is stretched from the first state to the second state, the first region has a first stretching ratio (R1) and the second region has a second stretching ratio (R2), and R1 is greater than R2.

8 Claims, 13 Drawing Sheets

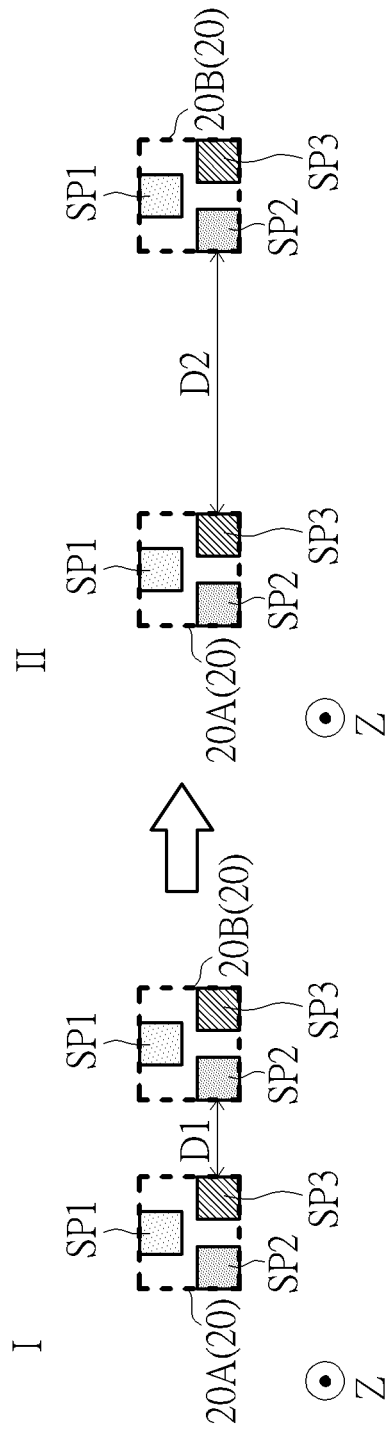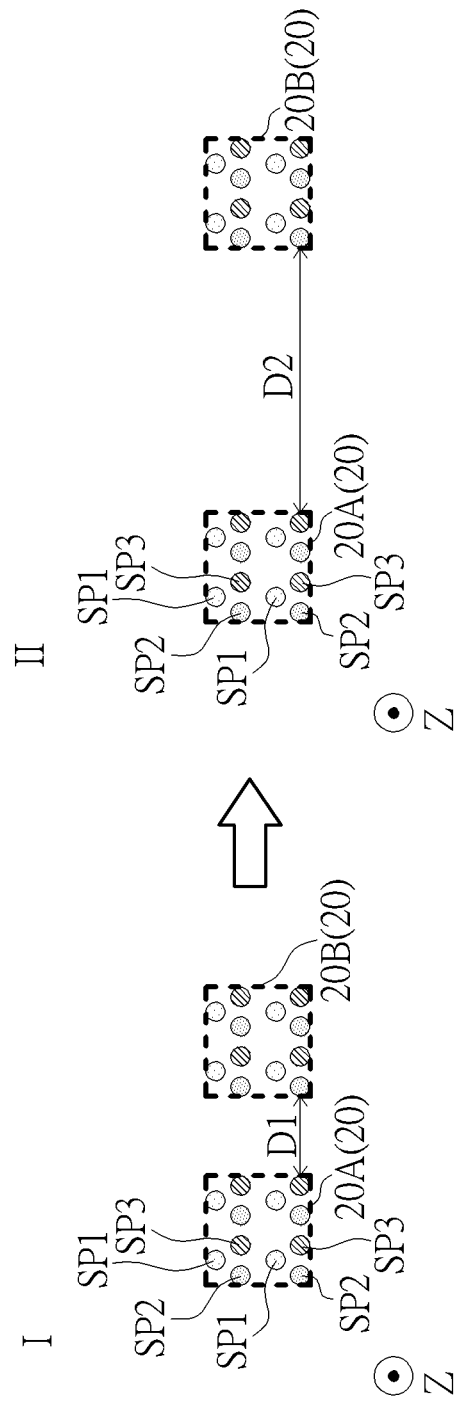

STRETCHABLE ELECTRONIC DEVICE

CROSS REFERENCE TO RELATED APPLICATIONS

This application is a continuation application of U.S. application Ser. No. 17/243,504, filed on Apr. 28, 2021, which is a division of U.S. application Ser. No. 16/425,922, filed on May 29, 2019. The contents of these applications are incorporated herein by reference.

BACKGROUND OF THE DISCLOSURE

1. Field of the Disclosure

The present disclosure is related to an electronic device, and more particularly, to a stretchable electronic device.

2. Description of the Prior Art

In recent years, display devices have become more and more important for being applied to various applications, such as smartphones, tablets, notebooks, and electronic book readers, and wearable devices, such as smart watches. The related manufacturers still keep on developing new types of display devices. For example, a display area of a stretchable display device may be enlarged for specific purposes and the size of the stretchable display device may be relatively small for being portable as the stretchable display device is not stretched. However, there are still some issues, such as reliability and lifetime, have to be improved for commercializing the stretchable display device.

SUMMARY OF THE DISCLOSURE

According to some embodiments, an electronic device stretchable from a first state to a second state is provided. The electronic device includes a substrate, a plurality of light emitting groups, and a plurality of signal pads. The substrate has a first region and a second region. The light emitting groups are disposed on the first region. The signal pads are disposed on the second region. When the electronic device is stretched from the first state to the second state, the first region has a first stretching ratio (R1) and the second region has a second stretching ratio (R2), and the first stretching ratio (R1) is greater than the second stretching ratio (R2).

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 4 is a schematic drawing illustrating light emitting groups in the electronic device when the electronic device is stretched from the first state to the second state according to an embodiment of the present disclosure.

FIG. 5 is a schematic drawing illustrating light emitting groups in the electronic device when the electronic device is stretched from the first state to the second state according to another embodiment of the present disclosure.

DETAILED DESCRIPTION

The present disclosure has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present disclosure.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Additionally, terms, such as "bottom", "below", "above", "top", and the like, may be used herein for ease of description to describe one element or feature's relationship to another element(s) or feature(s) as illustrated in the figures. If the device in the figures in turned over, elements described as "above" can become "below". It will be understood that spatially relative terms are intended to encompass different orientations of the device in use or operation in addition to the orientations depicted in the figures The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

It will be understood that several embodiments shown below describe different technical features respectively. But these technical features can also be mixed or combined in various ways if they are not conflict to each other.

Figure 1:
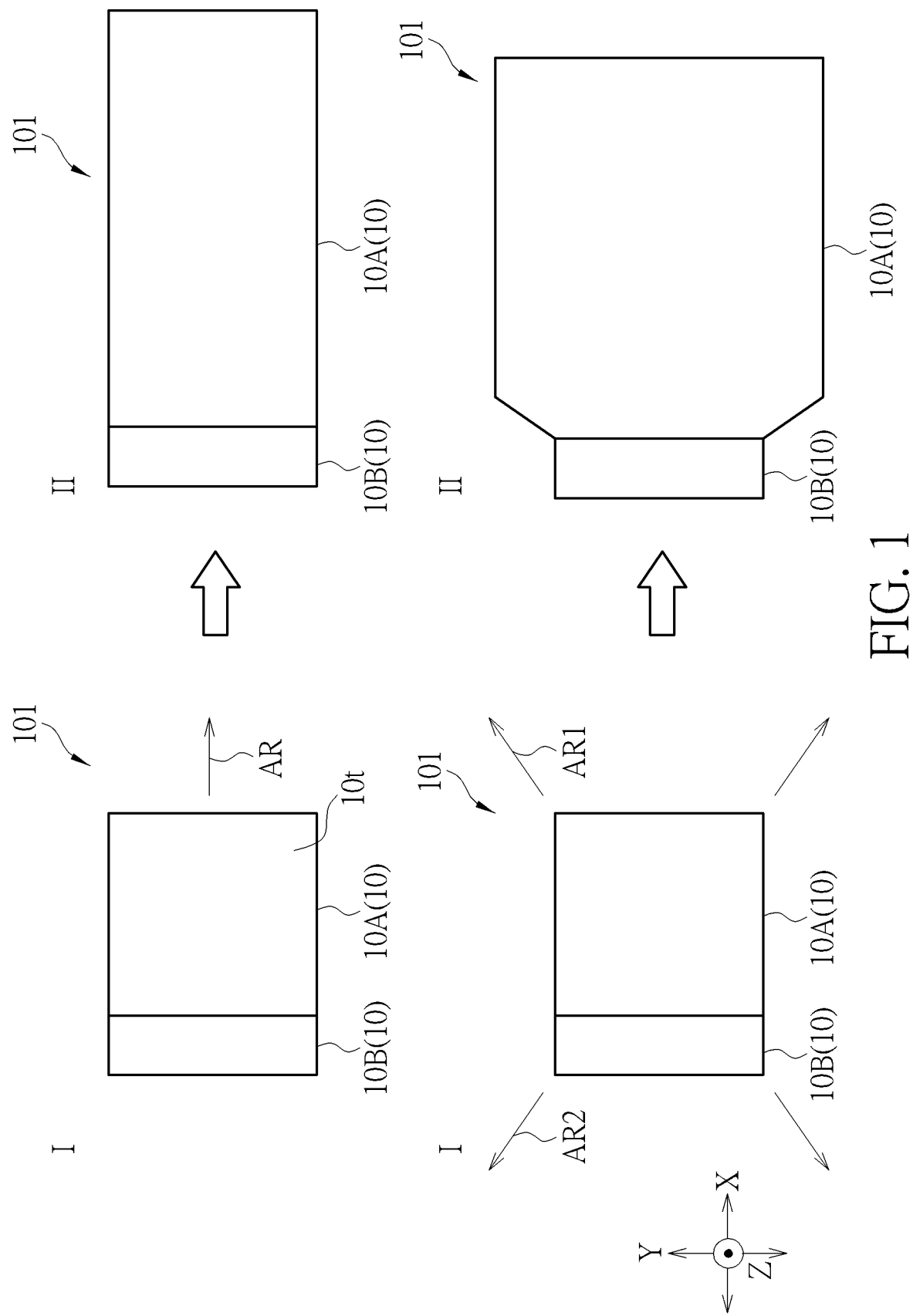
FIG. 1 is a schematic drawing illustrating an electronic device stretchable from a first state to a second state in different stretching directions according to a first embodiment of the present disclosure.

Please refer to FIG. 1. FIG. 1 is a schematic drawing illustrating an electronic device stretchable from a first state to a second state according to a first embodiment of the present disclosure. As shown in FIG. 1, an electronic device 101 is provided in this embodiment. The electronic device 101 includes a substrate 10 having a first region 10A and a second region 10B, and the electronic device 101 is stretchable from a first state I to a second state II. In some embodiments, as shown in the upper portion of FIG. 1, the substrate 10 may be stretchable in a stretching direction AR from the first state I to the second state II. The stretching direction AR can be parallel to a top surface of 10$t$ the substrate 10. The second region 10B may be located at a side of the first region 10A in a first direction X. The first direction X can be parallel to the top surface 10$t$ of the substrate 10, and can be parallel to the stretching direction AR. After stretching, the width of the first region 10A can be changed, for example, increased along the first direction X. After stretching, the area of the substrate 10 can be changed, for example, increased.

In some embodiments, as shown in the lower portion of FIG. 1, the substrate 10 may be stretchable along two directions, as shown in arrows AR1 and AR2 from the first state I to the second state II, but not limited thereto. After stretching, the width of the first region 10A can be increased along the first direction X, and the length of the first region 10A can be increased along a second direction Y. The second direction Y can be parallel to the top surface 10$t$ of the substrate and perpendicular to the first direction X. After stretching, the area of the substrate 10 can be changed, for example, increased.

Figure 2:
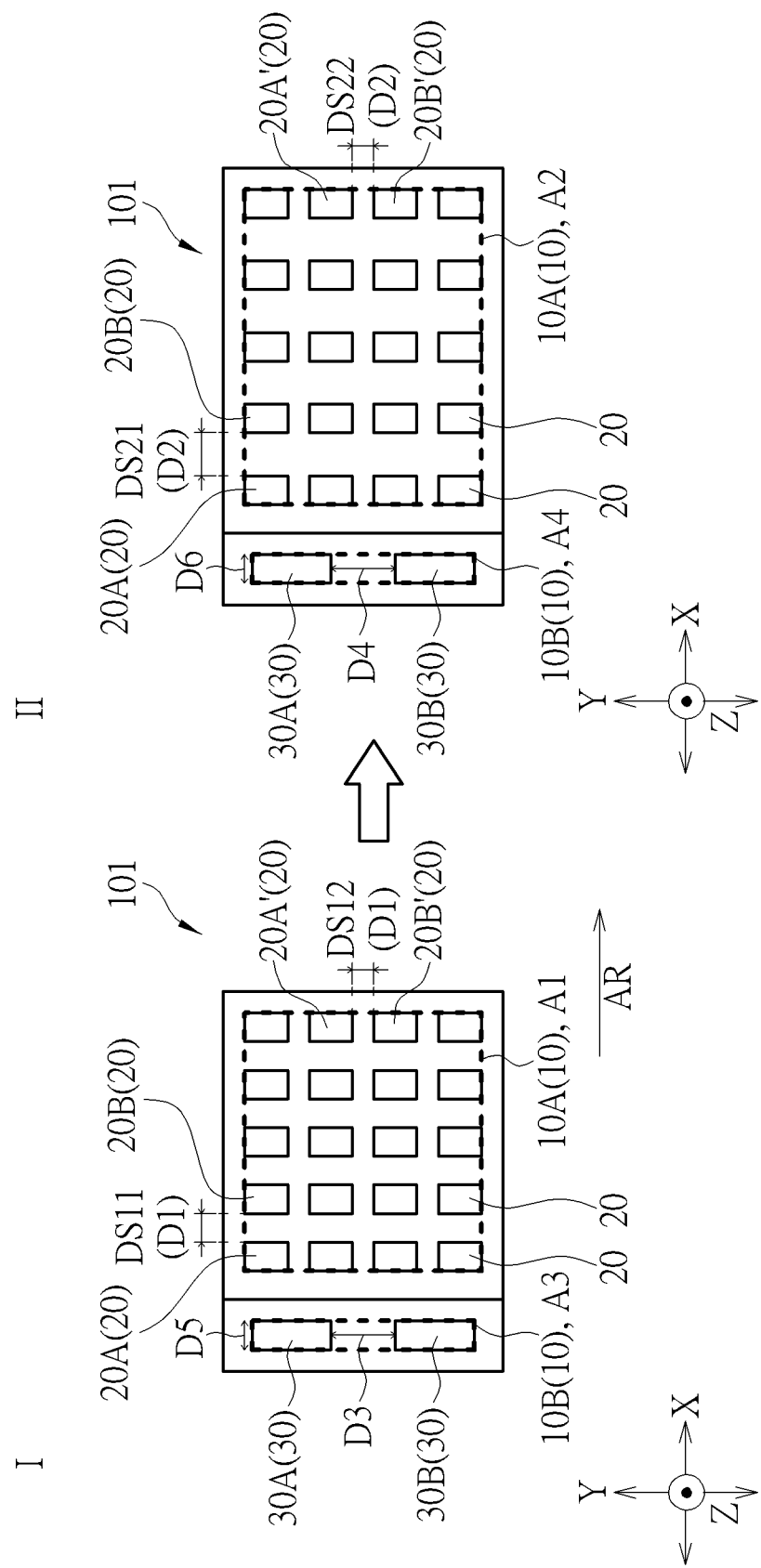
FIG. 2 is a schematic drawing illustrating the electronic device stretched from the first state to the second state according to the first embodiment of the present disclosure.

As shown in FIG. 2, the electronic device 101 may include a plurality of light emitting groups 20 disposed on the first region 10A and a plurality of signal pads 30 disposed on the second region 10B. Specifically, in some embodiments, referring to FIG. 1 and FIG. 2, the first region 10A may be a region defined by the outermost edges of the outermost light emitting groups 20, as shown in the region surrounded by the dash line. The second region 10B may be a region defined by the outermost edges of the outermost signal pads 30, as shown in the region surrounded by the dash line. In some embodiments, a stretching ratio may be defined as a ratio of the distance change between two specific points before and after stretching to the distance between the two specific points before stretching. In some embodiments, a stretching ratio may be defined as a ratio of the area change of a specific region before and after stretching to the area of the specific region before stretching.

In some embodiments, when the electronic device 101 is stretched from the first state I to the second state II, the first region 10A may have a first stretching ratio (R1), the second region 10B may have a second stretching ratio (R2), and the first stretching ratio (R1) may be greater than the second stretching ratio (R2). In some embodiments, signal input issues during stretching operations of the electronic device 101 can be improved, and the reliability and the lifetime of the electronic device 101 can be enhanced.

In some embodiments, the first stretching ratio (R1) of the first region 10A and the second stretching ratio (R2) of the second region 10B may be conformed with the following equation (I), but not limited thereto.

$$1.2 \le \frac{R1}{R2} \le 100 \tag{I}$$

Please refer to FIG. 2 and FIG. 4. In some embodiments, each of the light emitting groups 20 may include at least three light emitting elements, for example, a first light emitting element SP1, a second light emitting element SP2, and a third light emitting element SP3, as shown in FIG. 4. The first light emitting element SP1, the second light emitting element SP2, and the third light emitting element SP3 can be of different colors. In some embodiments, the light emitting elements can be inorganic light emitting diodes (LEDs), mini LEDs, micro LEDs, organic light emitting diodes (OLEDs), or other suitable types of light emitting elements. The signal pads 30 may be used to be bonded with other circuit structures (not shown in FIG. 2), such as a flexible print circuit (FPC) structure, a chip on film (COF) structure, a driving integrated circuit (IC) structure, or other suitable circuit structures. The signal pads 30 may be composed of metallic conductive material, transparent conductive material, or other suitable types of conductive material.

Still referring to FIG. 2, in some embodiments, the plurality of light emitting groups 20 may include a first light emitting group 20A and a second light emitting group 20B disposed adjacent to the first light emitting group 20A, and the plurality of signal pads 30 may include a first signal pad 30A and a second signal pad 30B disposed adjacent to the first signal pad 30A. The first light emitting group 20A and the second light emitting group 20B can be adjacent to each other along the stretching direction AR, and/or along the first direction X. When the electronic device 101 is stretched from the first state I to the second state II, the first light emitting group 20A and the second light emitting group 20B may have a first distance D1 (DS11) therebetween in the first state I, and may have a second distance D2 (DS21) therebetween in the second state II, for example, along the first direction X. The first signal pad 30A and the second signal pad 30B may have a third distance D3 therebetween in the first state I, and may have a fourth distance D4 therebetween in the second state II, for example, along the second direction Y. In some embodiments, the first distance (D1), the second distance (D2), the third distance (D3), and the fourth distance (D4) described above may be conformed with anyone of or more than one of the following equation (II), the following equation (III), and the following equation (IV), but not limited thereto.

$$D2 > D1 \tag{II}$$

$$D4 \geq D3 \tag{III}$$

$$\frac{D2}{D1} > \frac{D4}{D3} \tag{IV}$$

Still referring to FIG. 2, in some embodiments, the plurality of light emitting groups 20 may include a first light emitting group 20A' and a second light emitting group 20B' disposed adjacent to the first light emitting group 20A'. The first light emitting group 20A' and the second light emitting group 20B' can be adjacent to each other along a direction different from the stretching direction AR, for example, along the second direction Y. When the electronic device 101 is stretched from the first state I to the second state II, the first light emitting group 20A' and the second light emitting group 20B' may have a first distance D1 (DS12) therebetween in the first state I, and may have a second distance D2 (DS22) therebetween in the second state II. In some embodiments, the first distance (D1), the second distance (D2), the third distance (D3), and the fourth distance (D4) described above may be conformed with anyone of or more than one of the following equation (II), the following equation (III), and the following (IV), but not limited thereto.

$$D2 > D1 \tag{II}$$

$$D4 \geq D3 \tag{III}$$

$$\frac{D2}{D1} > \frac{D4}{D3} \tag{IV}$$

In some embodiments, a fifth distance D5 may exist between two specific points disposed on the second region 10B in the first direction X in the first state I, and a sixth distance D6 may exist between the two specific points in the first direction X in the second state II. In some embodiments, a ratio of the distance DS21 to the distance DS11 (which may be regarded as a ratio of the second distance D2 to the first distance D1) and/or a ratio of the distance DS22 to the distance DS12 (which may be regarded as a ratio of the second distance D2 to the first distance D1 also) may be greater than a ratio of the fourth distance D4 to the third distance D3 and/or a ratio of the six distance D6 to the fifth distance D5, but not limited thereto. In some embodiments, the second distance D2 (DS21) may be greater than the first distance D1 (DS11), the fourth distance D4 may be greater than or equal to the third distance D3, the ratio of the distance DS21 to the distance DS11 may be greater than the ratio of the sixth distance D6 to the fifth distance D5, and the ratio of the distance DS22 to the distance DS12 may be greater than the ratio of the fourth distance D4 to the third distance D3. In other words, the first distance D1, the second distance D2, the third distance D3, the fourth distance D4, the fifth distance D5, and the sixth distance D6 described above may further be conformed with anyone of or two of the following equations (V) and (VI), but not limited thereto.

$$1.2 \leq \frac{(D2/D1)}{(D4/D3)} \leq 100 \tag{V}$$

$$1.2 \leq \frac{(D2/D1)}{(D6/D5)} \leq 100 \tag{VI}$$

In some embodiments, a ratio of the difference between the second distance D2 and the first distance D1 to the first distance D1 may be regarded as the first stretching ratio (R1) of the first region 10A described above, and a ratio of the difference between the fourth distance D4 and the third distance D3 to the third distance D3 may be regarded as the second stretching ratio (R2) of the second region 10B described above. In some embodiments, a ratio of difference between the sixth distance D6 and the fifth distance D5 to the fifth distance D5 may be regarded as the second stretching ratio (R2) of the second region 10B described above, but not limited thereto. Therefore, the first distance D1, the second distance D2, the third distance D3, the fourth distance D4, the fifth distance D5, and the sixth distance D6 described above may further be conformed with one of or two of the following equation (VII) and the following equation (VIII), but not limited thereto.

$$\frac{|D2 - D1|}{D1} > \frac{|D4 - D3|}{D3} \tag{VII}$$

$$\frac{|D2 - D1|}{D1} > \frac{|D6 - D5|}{D5} \tag{VIII}$$

Stilling referring to FIG. 2, in some embodiments, the first region 10A of the substrate 10 may have a first projection area A1 in the first state I, the first region 10A of the substrate 10 may have a second projection area A2 in the second state II, and the second projection area A2 may be greater than the first projection area A1. Additionally, the second region 10B of the substrate 10 may have a third projection area A3 in the first state I, and the second region 10B of the substrate 10 may have a fourth projection area A4 in the second state II. The first projection area A1, the second projection area A2, the third projection area A3, and the fourth projection area A4 may be projection areas in a vertical direction Z perpendicular to the surface of the substrate 10, but not limited thereto. The vertical direction Z can be perpendicular to the first direction X and the second direction Y. In some embodiments, the first stretching ratio can be defined as |A2−A1|/A1, and the second stretching ratio can be defined as |A4−A3|/A3. The first projection area A1, the second projection area A2, the third projection area A3, and the fourth projection area A4 may be conformed with the following equation (IX), but not limited thereto.

$$\frac{|A2 - A1|}{A1} > \frac{|A4 - A3|}{A3} \tag{IX}$$

Figure 3:
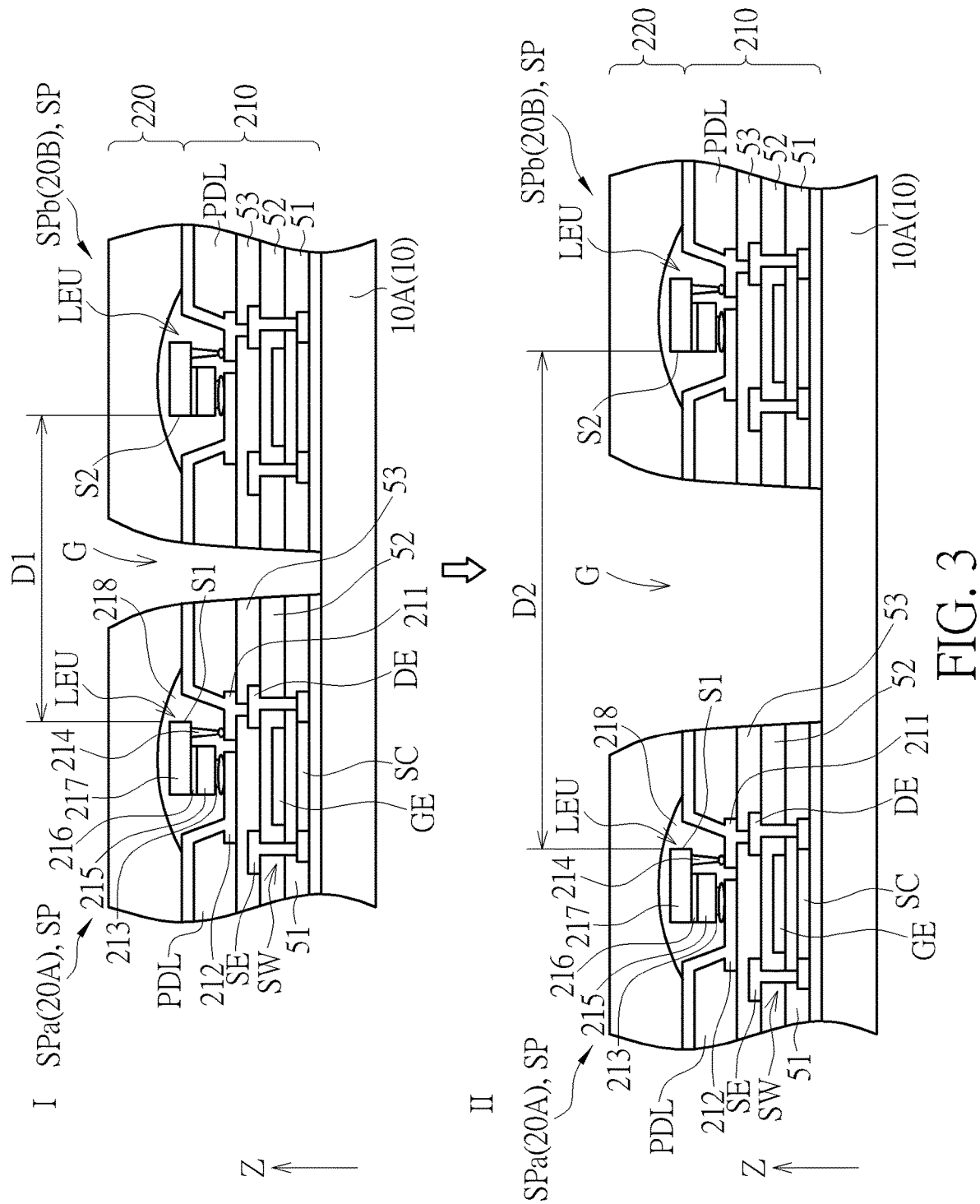
FIG. 3 is a schematic cross-sectional drawing illustrating a first region of a substrate in the electronic device when the electronic device is stretched from the first state to the second state according to the first embodiment of the present disclosure.

Please refer to FIG. 2, and FIG. 3. FIG. 3 is a schematic cross-sectional drawing illustrating the first region 10A of the substrate 10 in the electronic device 101 when the electronic device 101 is stretched from the first state I to the second state II in this embodiment. As shown in FIG. 2 and FIG. 3, in some embodiments, a display layer 210 may be disposed on the substrate 10, and a functional layer 220 may be disposed on the display layer 210, but not limited thereto. The display layer 210 can include the plurality of light emitting groups 20. In some embodiments, each of the light emitting groups 20 may include a plurality of light emitting units SP, and each of the light emitting units SP may be regarded as a subpixel, but not limited thereto. The display layer 210 may include a plurality of the light emitting units SP, wires, electrodes, switch elements and/or driving elements, but not limited thereto. For example, one light emitting unit SP can include a light emitting element LEU that can produce light beam, such as the primary light beam (such as red light, blue light, and green light), for display images. In some embodiments, one light emitting unit SP may include one light emitting element LEU, and at least one switching element SW can be electrically connected to the light emitting element LEU. In some embodiments, the light emitting element LEU may be an inorganic light emitting diode (LED), a mini LED, a micro LED, an organic light emitting diode (OLED), or other suitable light emitting elements. In some embodiments, the switching element SW may be a thin film transistor, but not limited thereto. The display layer 210 can further include a pixel defining layer PDL, that can define the light emitting region or the region of one light emitting unit SP. Referring to FIG. 3, in some embodiments, when the electronic device 101 is stretched from the first state I to the second state II, the distance between two adjacent subpixels in two adjacent light emitting groups 20 may also be stretched. Specifically, in the first state I, the first distance D1 can be measured from a first specific point (for example, a first side 51) of the light emitting unit SPa of one light emitting group 20A to a second specific point (for example, a second side S2) of the light emitting unit SPb of another light emitting group 20B. In the second state II, the second distance D2 is measured from the same specific points as in the first state I. In detail, the second distance D2 can be measured from the first side 51 of the light emitting unit SPa of the light emitting group 20A to the second side S2 of the light emitting unit SPb of the light emitting group 20B. In some embodiments, the first specific point and the second specific point can be other points. For example, the first specific point can be the center of the light emitting unit SPa, and the second specific point can be the center of the light emitting unit SPb. In some embodiments, the distance between two adjacent light emitting groups 20 may be a distance between two adjacent subpixels of different light emitting groups 20 adjacent to each other.

As shown in FIG. 3, in some embodiments, the light emitting elements LEU may be a flip-type micro-LED, but not limited thereto. Each of the light emitting elements LEU may include a first electrode 213, a second electrode 214, a first semiconductor layer 215, a light emitting layer 216, and a second semiconductor layer 217. The light emitting layer 216 may be, but not limited to, a multiple quantum well (MQW) layer. The first electrode 213 may be electrically connected to a common electrode through a bonding pad 212. In addition, when the switching element SW is a thin film transistor, it may include a gate electrode GE, a source electrode SE, a drain electrode DE, and a semiconductor layer SC. The source electrode SE and the drain electrode DE may be electrically connected to the semiconductor layer SC respectively and an insulating layer 51 may be located between the gate electrode GE and the semiconductor layer SC. The source electrode SE may be electrically connected to a signal line (not shown) for example. The drain electrode DE may be electrically connected to a bonding pad 211 or a connection layer that is electrically connected to the corresponding light emitting element LEU. The functional layer 220 may include a touch layer, a cover layer, an anti-refection layer, a protection layer 218, or combinations thereof. In some embodiments, a filler (not shown) and/or wirings (not shown) may be disposed in the gap G between the light emitting groups 20, and the filler may be elastic material or adhesive material, but not limited thereto.

Please refer to FIG. 2, FIG. 4, and FIG. 5. FIG. 4 is a schematic drawing illustrating the light emitting groups 20 in the electronic device 101 when the electronic device 101 is stretched from the first state I to the second state II according to an embodiment of the present disclosure, and FIG. 5 is a schematic drawing illustrating the light emitting groups 20 in the electronic device 101 when the electronic device 101 is stretched from the first state I to the second state II according to another embodiment of the present disclosure. The region of one light emitting group 20 may be defined by the outermost edges of the outermost light emitting units that are included in the same light emitting group 20. That is, the region surrounded by the dash line, as shown in FIG. 4 and FIG. 5. Thus, the area of one light emitting group 20 is the area of the region surrounded by the dash line. Therefore, the distance between two adjacent light emitting groups 20 may be the distance between two adjacent subpixels from different light emitting groups 20. In addition, one light emitting group 20 can include at least two subpixels and may be defined as a smallest unit which comprises a group of subpixels shifting and/or rotating as a whole.

As shown in FIG. 2 and FIG. 4, in some embodiments, each of the light emitting groups 20 may include a plurality of light emitting units configured to emit light beams of different colors. For example, referring to FIG. 4, each of the light emitting groups 20 may include a first light emitting unit SP1, a second light emitting unit SP2, and a third light emitting unit SP3 for emitting light beams of different colors. Each of the light emitting units may be regarded as a subpixel. In some embodiments, one light emitting group may include more than one first light emitting unit SP1, more than one second light emitting unit SP2, and more than one third light emitting unit SP3. For example, referring to FIG. 5, at least one light emitting group 20 may include a plurality of (for example, four) first light emitting units SP1, a plurality of (for example, four) second light emitting units SP2, and a plurality of (for example, four) third light emitting units SP3. The first light emitting unit SP1, the second light emitting unit SP2, and the third light emitting unit SP3 are of different colors.

When the electronic device 101 is stretched from the first state I to the second state II, the distance between two adjacent light emitting groups 20 may be enlarged. The distance between the light emitting units within the same light emitting group 20 may be substantially unchanged. Thus, in some embodiments, the influence of the stretching operations on the display images generated by the electronic device 101 can be reduced.

Figure 6:
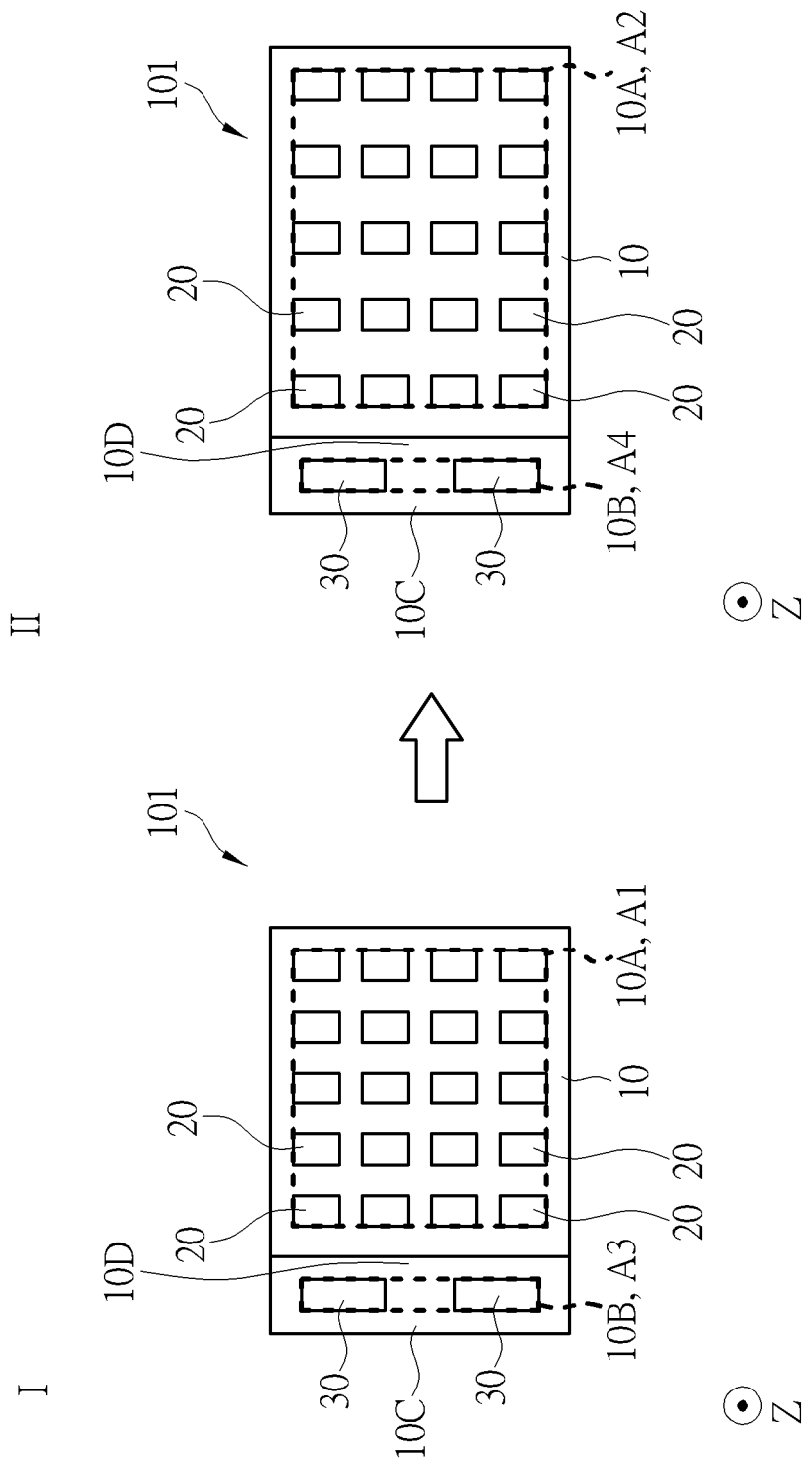
FIG. 6 is a schematic drawing illustrating the electronic device stretched from the first state to the second state according to another embodiment of the present disclosure.

Please refer to FIG. 6. FIG. 6 is a schematic drawing illustrating the electronic device 101 stretched from the first state I to the second state II according to another embodiment of the present disclosure. The definitions and relationships of first region 10A, second region 10B, the first projection area A1, the second projection area A2, the third projection area A3, and the fourth projection area A4 can be referred to the description for FIG. 2. Additionally, in some embodiments, the substrate 10 may further include a third region 10C and a fourth region 10D respectively located at two opposite sides of the second region 10B in the first direction X, and the fourth region 10D may be located between the second region 10B and the first region 10A in the first direction X. When the electronic device 101 is stretched from the first state I to the second state II, the third region 10C may have a third stretching ratio, the fourth region 10D may have a fourth stretching ratio, and the fourth stretching ratio may be greater than the third stretching ratio, but not limited thereto. The definition of the third stretching ratio and the fourth stretching ratio may be similar to the first stretching ratio and the second stretching ratio described above and will not be redundantly described.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 7:
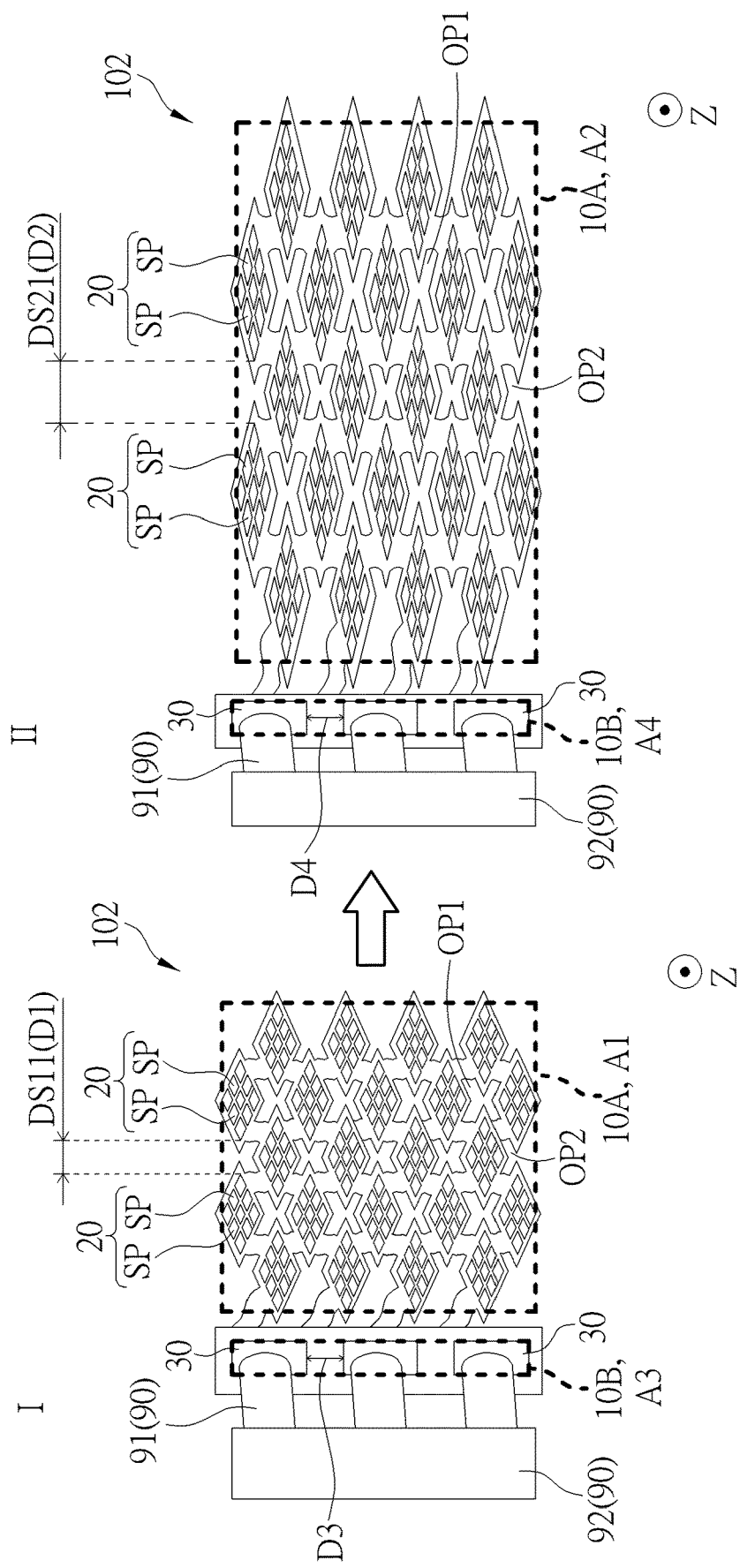
FIG. 7 is a schematic drawing illustrating an electronic device stretched from a first state to a second state according to a second embodiment of the present disclosure.

Please refer to FIG. 7. FIG. 7 is a schematic drawing illustrating an electronic device 102 stretched from a first state I to a second state II according to a second embodiment of the present disclosure. As shown in FIG. 7, in the electronic device 102, the substrate 10 may include an first opening OP1 disposed between two of the light emitting groups 20 adjacent to each other in a top view of the electronic device 102. In some embodiments, the substrate 10 may include a plurality of the first openings OP1 disposed between the light emitting groups 20. In some embodiments, it will be more feasible to stretch the substrate 10 with the first openings OP1, but not limited thereto. In some embodiment, a portion of the substrate 10 between two of the adjacent signal pads 30 may have no opening. In some embodiments, the substrate 10 may further include one or more second openings OP2 at an edge of the substrate 10, but not limited thereto. In addition, the electronic device 102 may further include a circuit structure 90 connected to the signal pads 30. In some embodiments, the circuit structure 90 may include a first portion 91 and a second portion 92. The first portion 91 of the circuit structure 90 may be connected to the signal pads 30, and the second portion 92 of the circuit structure 90 may be electrically connected to the signal pads 30 via the first portion 91. In some embodiments, the first portion 91 of the circuit structure 90 may include FPC, COF, or other suitable structures, and the second portion 92 of the circuit structure 90 may include a driving IC or other suitable structures.

As shown in FIG. 7, in some embodiments, the first region 10A may be regarded as a region surrounding the light emitting groups 20 from a top view of electronic device 102, and the second region 10B may be regarded as a region surrounding the signal pads 30 from the top view of electronic device 102. Specifically, the first region 10A may be defined by the outermost edges of the outmost light emitting groups 20. The second region 10B may be defined by the outermost edges of the outmost signal pads 30. Thus, the first region 10A is the area of the region surrounded by the dash line and including the light emitting groups 20 in FIG. 6, and the second region 10B is the area of the region surrounded by the dash line and including the signal pads 30 in FIG. 6. Therefore, an area marked with 10A in the left half of FIG. 7 may be regarded as the first projection area A1 of the first region 10A in the first state I, an area marked with 10A in the right half of FIG. 7 may be regarded as the second projection area A2 of the first region 10A in the second state II, an area marked with 10B in the left half of FIG. 7 may be regarded as the third projection area A3 of the second region 10B in the first state I, and an area marked with 10B in the right half of FIG. 7 may be regarded as the fourth projection area A4 of the first region 10A in the second state II, but not limited thereto.

Figure 8:
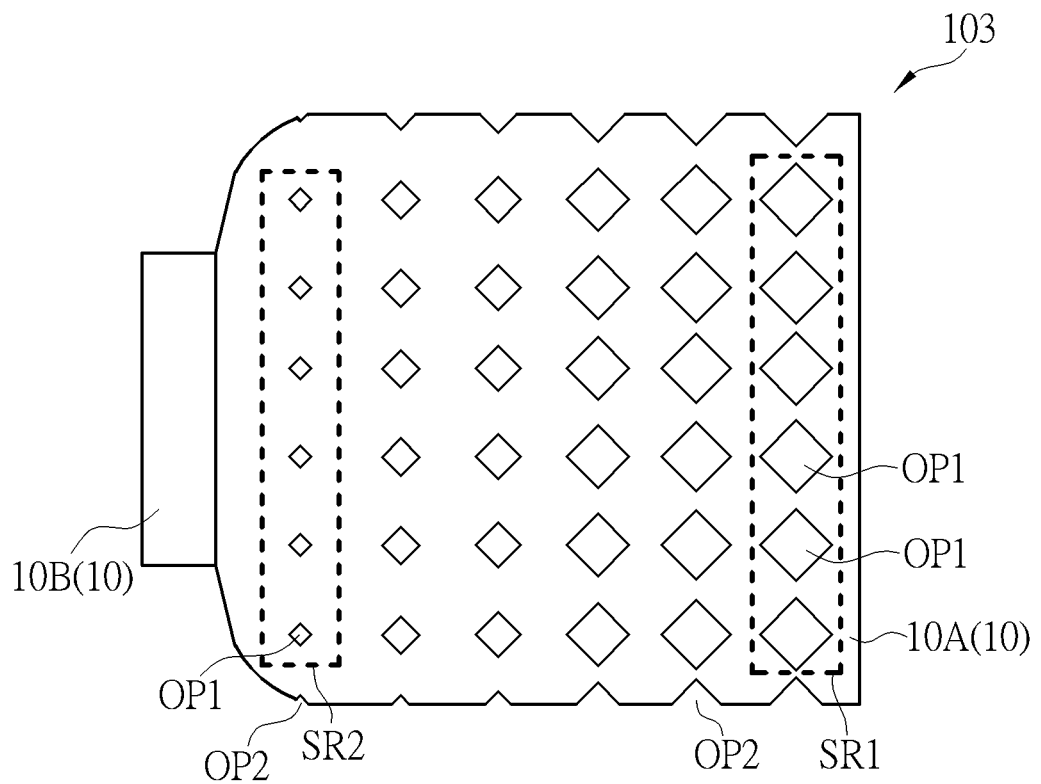
FIG. 8 is a schematic drawing illustrating an electronic device according to a third embodiment of the present disclosure.

Please refer to FIG. 8. FIG. 8 is a schematic drawing illustrating an electronic device 103 according to a third embodiment of the present disclosure. As shown in FIG. 8, in the electronic device 103, the first region 10A may include a first sub region SR1 and a second sub region SR2, and the second sub region SR2 may be located between the first sub region SR1 and the second region 10B in the first direction X. In other words, the distance between the second sub region SR2 and the second region 10B may be shorter than the distance between the first sub region SR1 and the second region 10B in the first direction X. Additionally, the substrate 10 may include a plurality of the first openings OP1 and a plurality of the second openings OP2 described above, and the first openings OP1 may be disposed between the light emitting groups 20 and located in the first sub region SR1 and the second sub region SR2. In some embodiments, at least one of the first openings OP1 in the first sub region SR1 may be larger than at least one of the first openings OP1 in the second sub region SR2. In some embodiments, the second opening OP2 adjacent the first sub region SR1 may be larger than the second opening OP2 adjacent to the second sub region SR2. Thus, the stretching uniformity of the first region 10A and the display quality of the electronic device 103 during the stretching operations may be improved, but not limited thereto. In some embodiments, the areas of the first openings OP1 may be gradually increased from the region closer to the second region 10B to the region away from the second region 10B. In some embodiments, the areas of the second openings OP2 may be gradually increased from the region closer to the second region 10B to the region away from the second region 10B.

Figure 9:
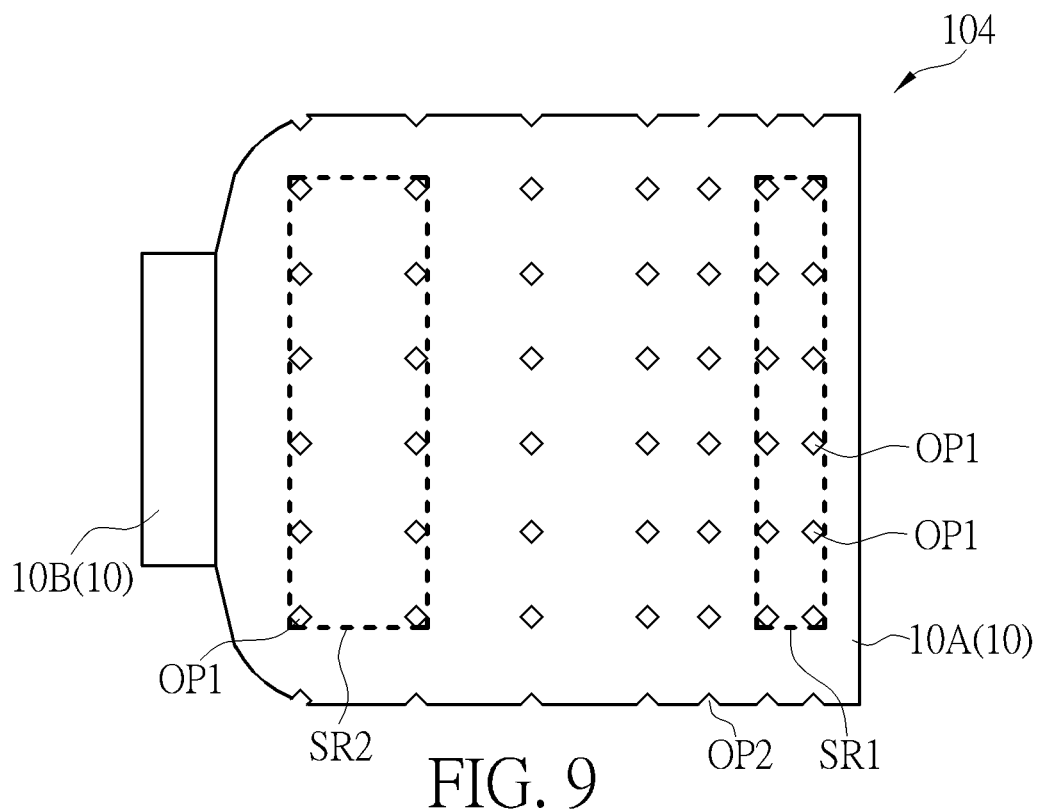
FIG. 9 is a schematic drawing illustrating an electronic device according to a fourth embodiment of the present disclosure.

Please refer to FIG. 9. FIG. 9 is a schematic drawing illustrating an electronic device 104 according to a fourth embodiment of the present disclosure. As shown in FIG. 9, in the electronic device 104, the first sub region SR1 and the second sub region SR2 are marked by the dash lines, and the first openings OP1 of the same number (for example, 12) are disposed in the first sub region SR1 and the second sub region SR2. The first sub region SR1 is less than the second sub region SR2. Thus, a density of the openings OP1 in the first sub region SR1 is higher than a density of the openings OP1 in the second sub region SR2. The stretching uniformity of the first region 10A and the display quality of the electronic device 104 during the stretching operations can be improved, but not limited thereto. In some embodiments, the density of the first openings OP1 may be gradually increased from the region closer to the second region 10B to the region away from the second region 10B.

Figure 10:
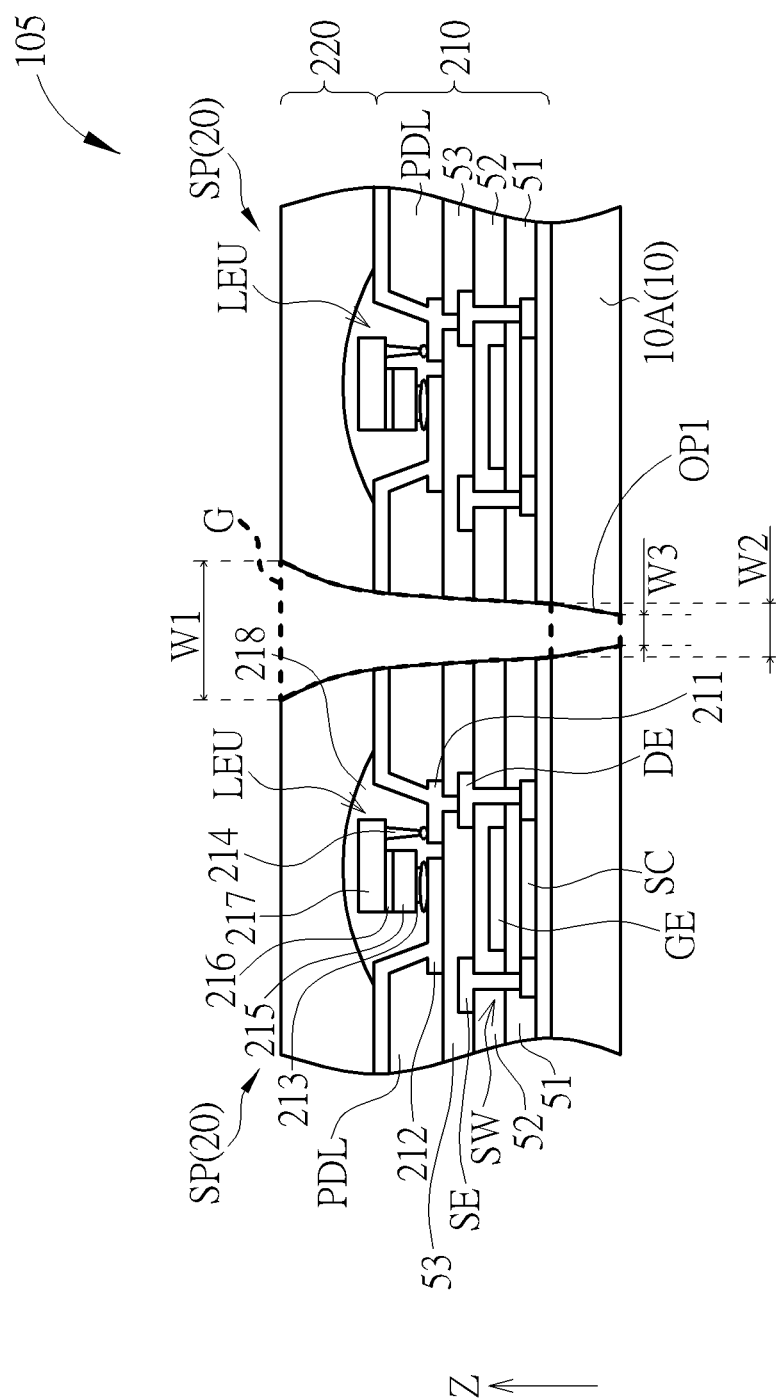
FIG. 10 is a schematic drawing illustrating an electronic device according to a fifth embodiment of the present disclosure.

Please refer to FIG. 10. FIG. 10 is a schematic drawing illustrating an electronic device 105 according to a fifth embodiment of the present disclosure. As shown in FIG. 10, in the electronic device 105, the first opening OP1 may be formed after a gap G between the light emitting groups 20 is formed. However, in some embodiments, the gap between light emitting groups 20 and the first opening OP1 in substrate 10 may be formed by the same process, such as an etching process, a laser treatment, or other suitable process. For example, when the process mentioned above is performed from the functional layer 220 to the substrate 10, a top width W1 of the gap between the light emitting groups 20 may be larger than a top width W2 of the first opening OP1, and the top width of the first opening OP1 may be larger than a bottom width W3 of the first opening OP1, but not limited thereto. In some embodiments, the display layer 210 may include the plurality of light emitting groups 20 and at least one insulating layer. For example, the display layer 210 can include an insulating layer 51 disposed between the semiconductor layer SC and the gate electrode GE, an insulating layer 52 disposed between the gate electrode GE and the source electrode SE, an insulating layer 53 disposed between the source electrode SE and the bonding pad 211, and an insulating layer PDL (pixel defining layer). In some embodiments, the first opening OP1 can be disposed in one of or more than one of the above insulating layers 51, 52, 53, and PDL, and also disposed in the substrate 10. In some embodiments, although not shown in figures, the first opening OP1 can be disposed in one of or more than one of the above insulating layers 51, 52, 53, and PDL, but not disposed in the substrate 10.

Figure 11:
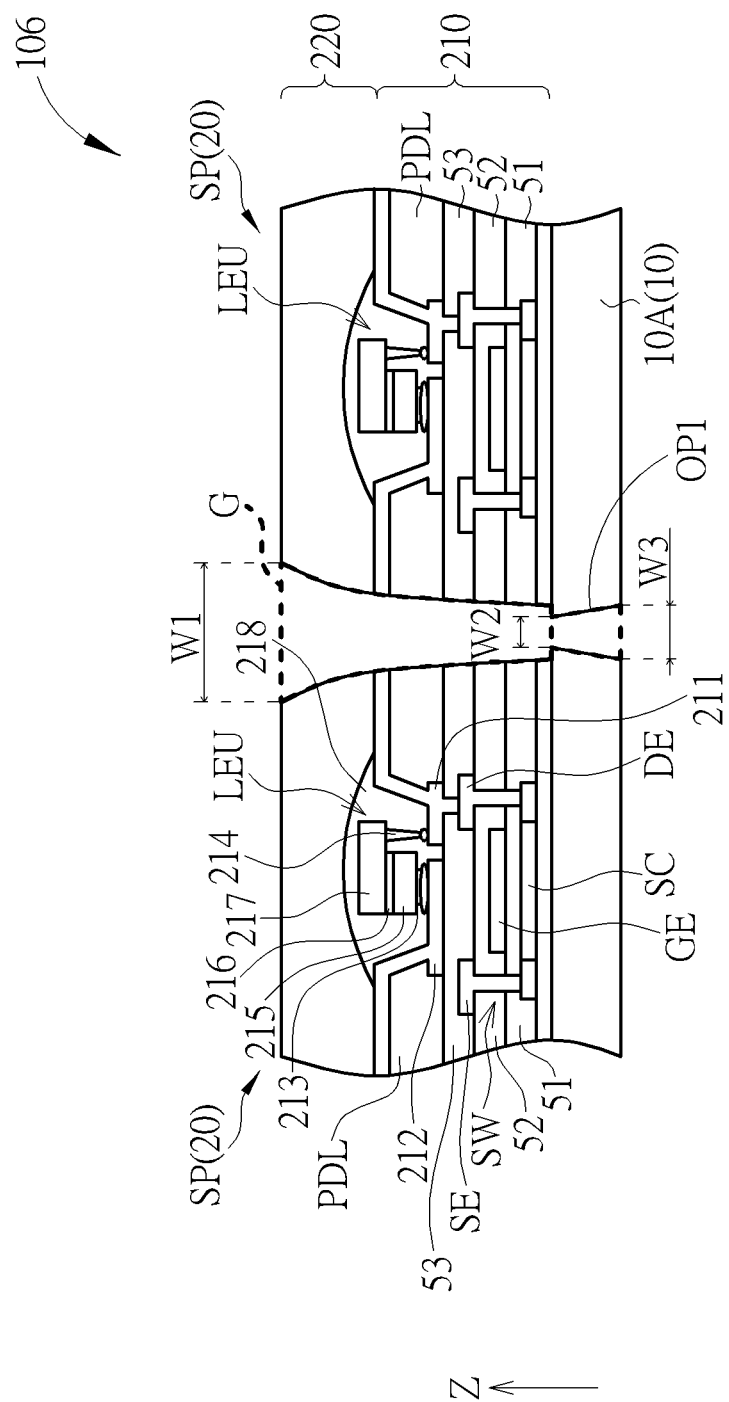
FIG. 11 is a schematic drawing illustrating an electronic device according to a sixth embodiment of the present disclosure.

Please refer to FIG. 11. FIG. 11 is a schematic drawing illustrating an electronic device 106 according to a sixth embodiment of the present disclosure. As shown in FIG. 11, in the electronic device 106, the first opening OP1 may be formed after the gap between the light emitting groups 20 is formed, and the first opening OP1 may be formed by a process (such as an etching process, a laser treatment, or other suitable process) performed from the backside of the substrate 10. Therefore, the bottom width W3 of the first opening OP1 may be larger than the top width W2 of the first opening OP1.

Figure 12:
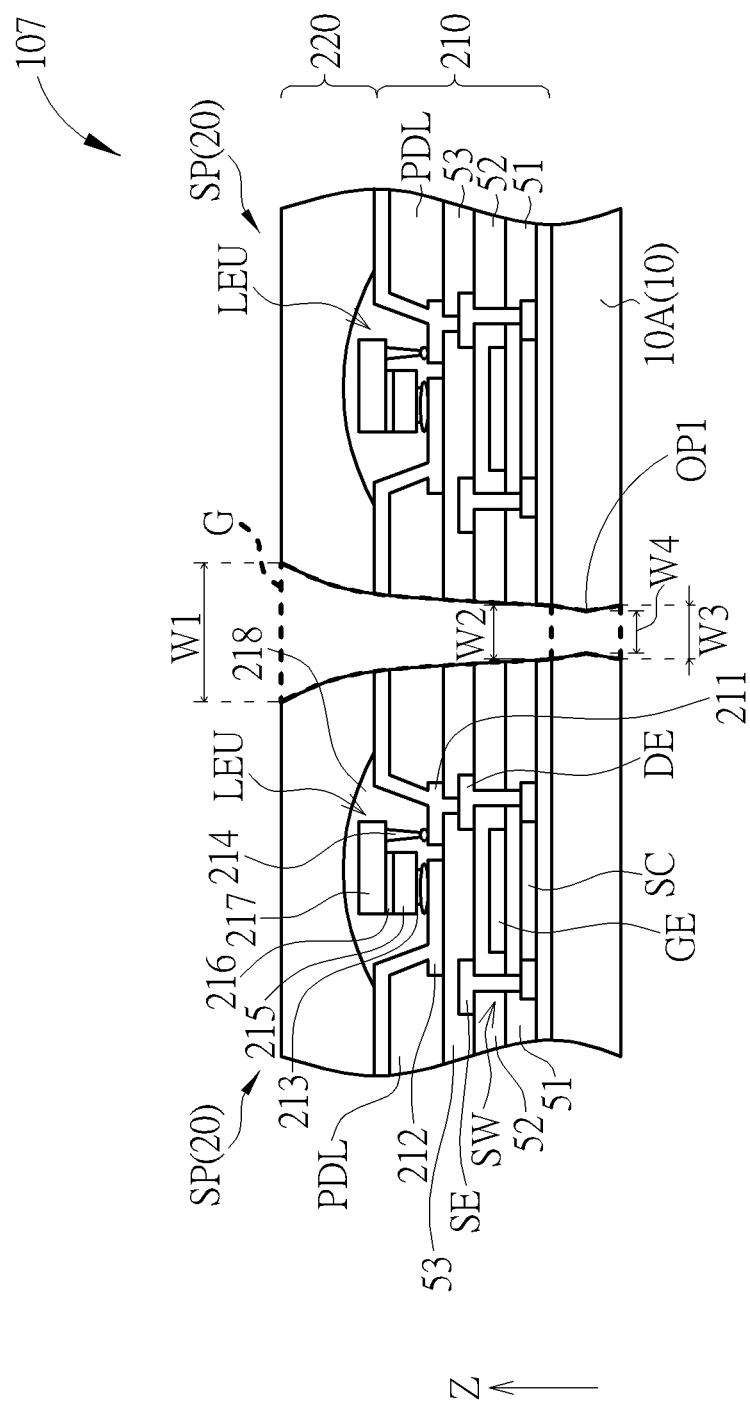
FIG. 12 is a schematic drawing illustrating an electronic device according to a seventh embodiment of the present disclosure.

Please refer to FIG. 12. FIG. 12 is a schematic drawing illustrating an electronic device 107 according to a seventh embodiment of the present disclosure. As shown in FIG. 12, in the electronic device 107, the gap between the light emitting groups 20 and the upper part of the first opening OP1 may be formed by the same process, and the lower part of the first opening OP1 may be formed by a process (such as an etching process, a laser treatment, or other suitable process) performed from the backside of the substrate 10. Therefore, the bottom width W3 of the first opening OP1 and the top width W2 of the first opening OP1 may be larger than a middle width W4 of the first opening OP1, but not limited thereto. The structure of the first opening OP1 is not limited to the conditions described in the embodiments shown in FIGS. 10-12, and the structure of the first opening OP1 described in the embodiments shown in FIGS. 10-12 may also be applied to the other embodiments of the present disclosure.

Figure 13:
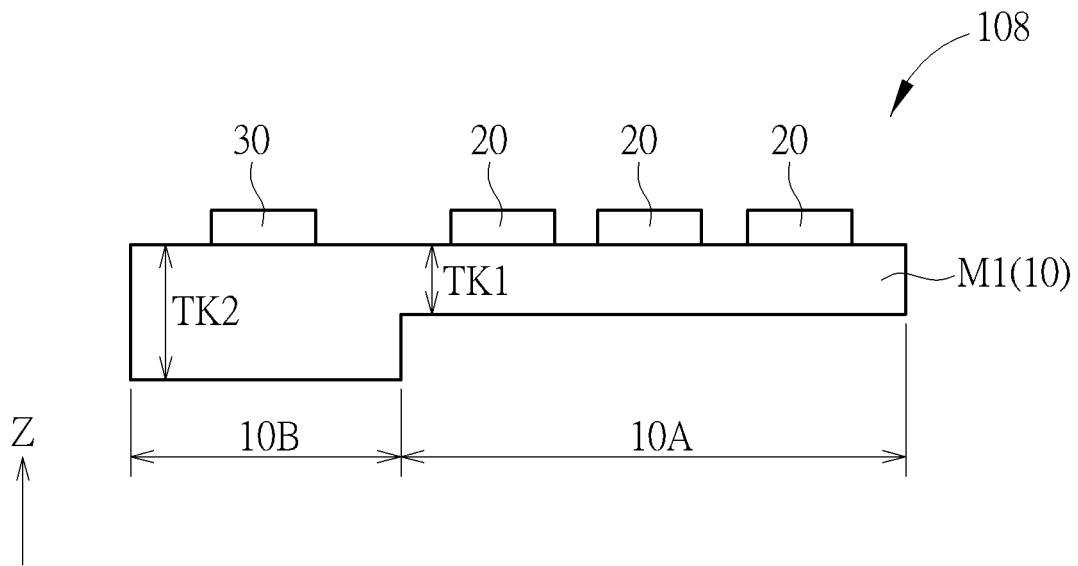
FIG. 13 is a schematic drawing illustrating an electronic device according to an eighth embodiment of the present disclosure.
Figure 14:
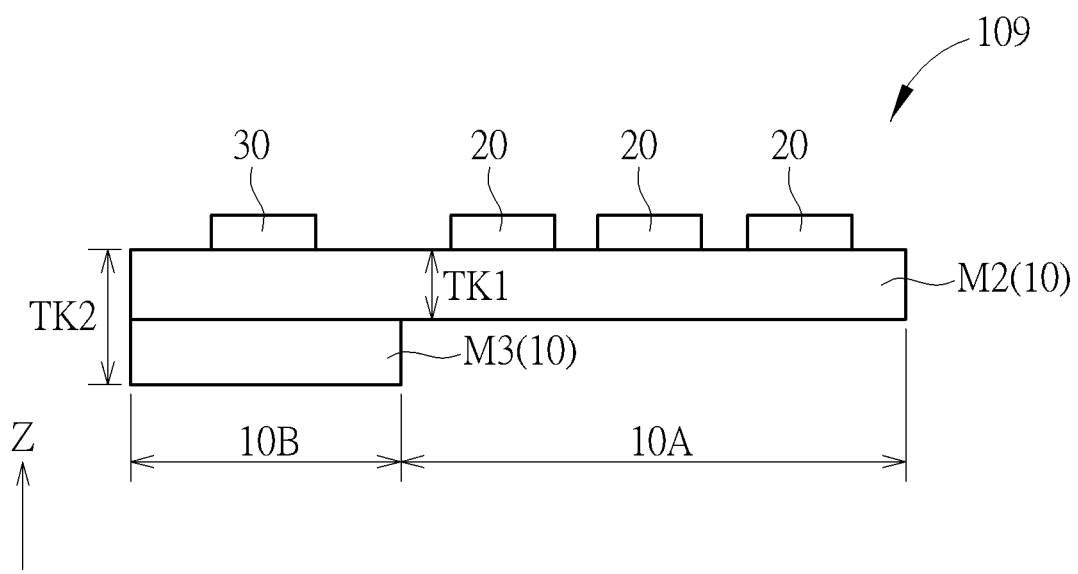
FIG. 14 is a schematic drawing illustrating an electronic device according to a ninth embodiment of the present disclosure.

Please refer to FIG. 13. FIG. 13 is a schematic drawing illustrating an electronic device 108 according to an eighth embodiment of the present disclosure. As shown in FIG. 13, in the electronic device 108, the first region 10A and the second region 10B of the substrate 10 may be made of the same material (such as a first material M1 shown in FIG. 13), and a thickness of the first region 10A (such as a first thickness TK1 shown in FIG. 13) may be less than a thickness of the second region 10B (such as a second thickness TK2 shown in FIG. 13). Thus, the first region 10A may easily to stretch, and the first stretching ratio of the first region 10A can be greater than the second stretching ratio of the second region 10B. In some embodiments, the first material M1 may be an elastic material having relatively lower Young's modulus, but not limited thereto Please refer to FIG. 14. FIG. 14 is a schematic drawing illustrating an electronic device 109 according to a ninth embodiment of the present disclosure. As shown in FIG. 14, in the electronic device 109, a material composition of the first region 10A may be different from a material composition of the second region 10B. For example, the first region 10A and the upper portion of the second region 10B may be made of the same material (such as a second material M2 shown in FIG. 16), and the lower portion of the second region 10B may be made of another material different from the second material M2 (such as a third material M3 shown in FIG. 14). In some embodiments, the Young's modulus of the third material M3 may be higher than the Young's modulus of the second material M2, but not limited thereto.

Figure 15:
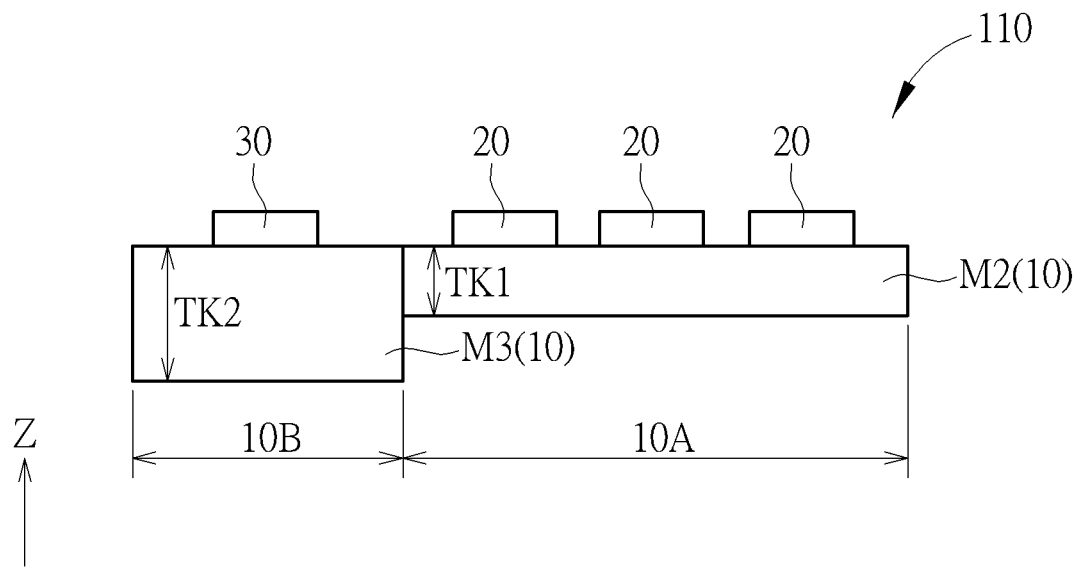
FIG. 15 is a schematic drawing illustrating an electronic device according to a tenth embodiment of the present disclosure.

Please refer to FIG. 15. FIG. 15 is a schematic drawing illustrating an electronic device 110 according to a tenth embodiment of the present disclosure. As shown in FIG. 15, in the electronic device 110, the first region 10A may be made of the second material M2, and the second region 10B may be made of the third material M3 different from the second material M2. The second thickness TK2 of the second region 10B may be greater than the first thickness TK1 of the first region 10A, but not limited thereto.

Figure 16:
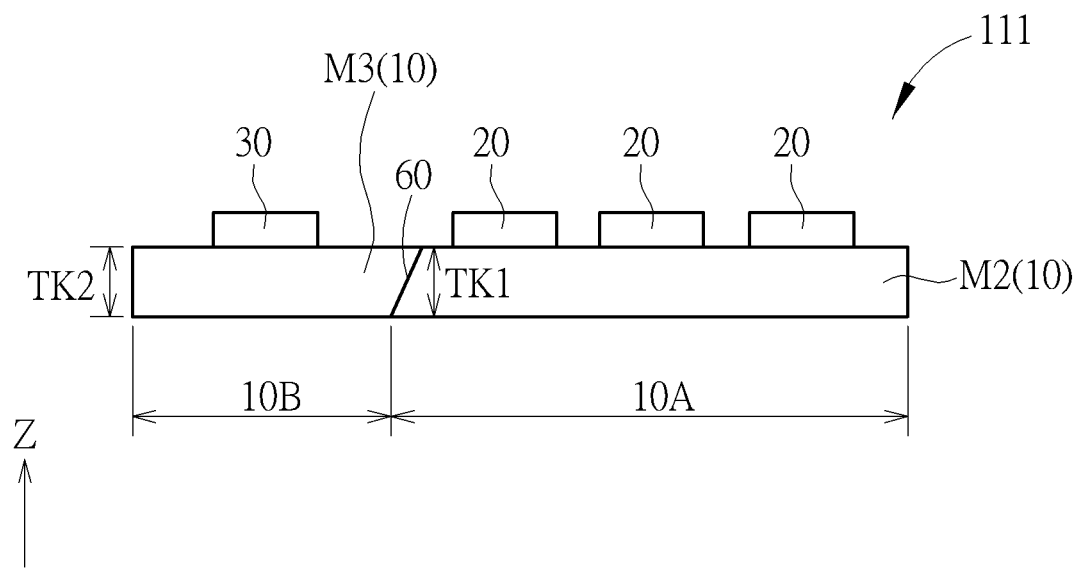
FIG. 16 is a schematic drawing illustrating an electronic device according to an eleventh embodiment of the present disclosure.

Please refer to FIG. 16. FIG. 16 is a schematic drawing illustrating an electronic device 111 according to an eleventh embodiment of the present disclosure. As shown in FIG. 16, in the electronic device 111, the first region 10A may be made of the second material M2, the second region 10B may be made of the third material M3 different from the second material M2, and the second thickness TK2 of the second region 10B may be substantially equal to the first thickness TK1 of the first region 10A. The interface between the second material M2 and the third material M3 may not be parallel to the vertical direction Z for enhancing the adhesion between the second material M2 and the third material M3. For example, the interface between the second material M2 and the third material M3 may include an incline shape 60 (as shown in FIG. 16), a zigzag shape, a wavy shape, a curve surface, a ladder shape structure, or other suitable structures for increasing the adhesion between the second material M2 and the third material M3. For easy illustration, FIG. 16 only shows the interface of wavy shape, and the interface can be of the above-mentioned shape or any other shape, although not shown in figures. The materials and the structure of the substrate 10 are not limited to the conditions described in the embodiments shown in FIGS. 13-16, and the materials and the structure of the substrate 10 described in the embodiments shown in FIGS. 13-16 may also be applied to the other embodiments of the present disclosure.

Figure 17:
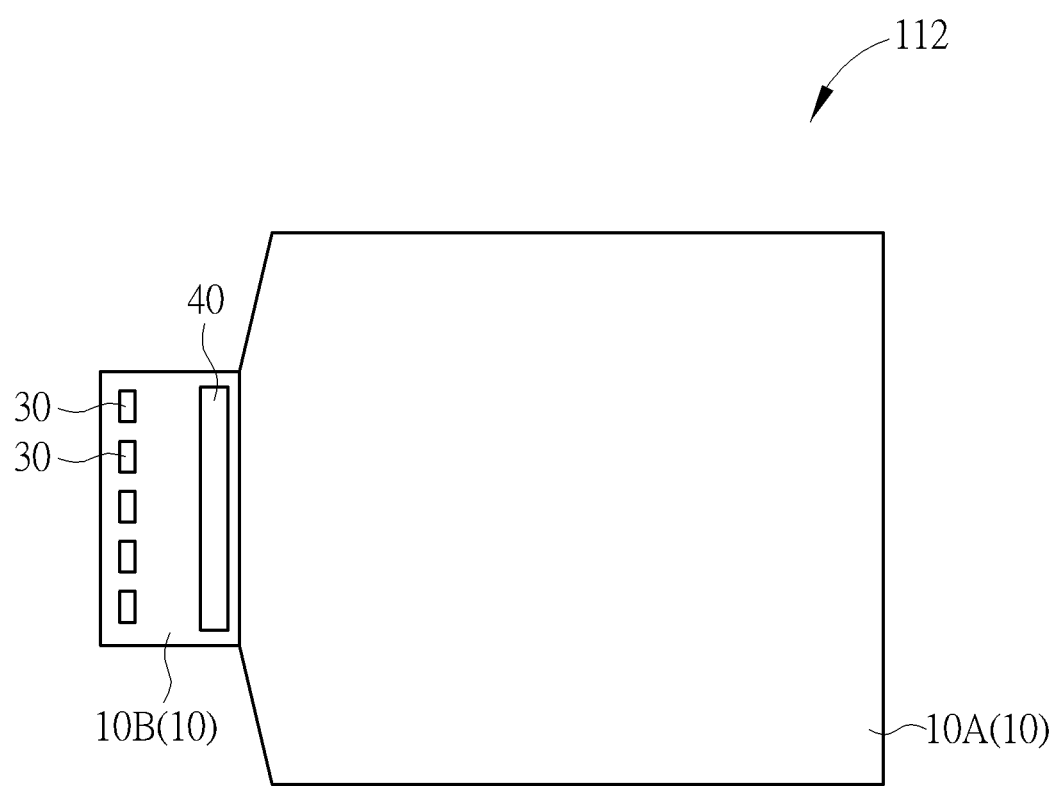
FIG. 17 is a schematic drawing illustrating an electronic device according to a twelfth embodiment of the present disclosure.

Please refer to FIG. 17. FIG. 17 is a schematic drawing illustrating an electronic device 112 according to a twelfth embodiment of the present disclosure. As shown in FIG. 17, the electronic device 112 may further include a circuit unit 40 disposed on the second region 10B of the substrate 10. The circuit unit 40 may be disposed between the signal pads 30 and the first region 10A. Specifically, the circuit unit 40 may be disposed on a part of the second region 10B located between the first region 10A and another part of the second region 10B on which the signal pads 30 are disposed, but not limited thereto. The circuit unit 40 may include a gate driving circuit, a demultiplexer (DeMux), or other functional circuit units. The circuit unit 40 in this embodiment may also be applied to the other embodiments of the present disclosure.

To summarize the above descriptions, in some embodiments, the electronic device and the substrate can be stretchable from the first state to the second state, and the region of the substrate on which the signal pads are disposed may have a stretching ratio less than a stretching ratio of another region of the substrate on which the light emitting groups are disposed. In some embodiments, signal input issues during the stretching operations can be improved. The reliability and the lifetime of the electronic device may be improved accordingly.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A stretchable electronic device, comprising:
 a substrate having an opening; and
 a display layer disposed on the substrate and comprising a first light emitting element and a second light emitting element,
 wherein a gap is located between the first light emitting element and the second light emitting element, the gap is overlapped with the opening of the substrate in a cross-sectional view of the stretchable electronic device, and
 wherein a top width of the opening is different from a bottom width of the gap and the top width of the opening is adjacent to the bottom width of the gap,
 wherein a top width of the gap is greater than a bottom width of the opening and the bottom width of the opening is greater than the top width of the opening.

2. The stretchable electronic device according to claim 1, wherein the top width of the gap is greater than the bottom width of the gap.

3. The stretchable electronic device according to claim 1, wherein the bottom width of the gap is greater than the top width of the opening.

4. The stretchable electronic device according to claim 1, wherein the display layer is disposed on a first region of the substrate, the stretchable electronic device further comprises a signal pad disposed on a second region of the substrate, and the second region is located adjacent to the first region.

5. The stretchable electronic device according to claim 4, wherein a stretching ratio of the first region is greater than a stretching ratio of the second region and a thickness of the first region is less than a thickness of the second region.

6. The stretchable electronic device according to claim 4, further comprising:
 a circuit structure comprising a first portion and a second portion, wherein the first portion is disposed on the second region and connected to the signal pad, and the second portion is electrically connected to the signal pad through the first portion.

7. The stretchable electronic device according to claim 4, wherein a material composition of the first region is different from a material composition of the second region.

8. The stretchable electronic device according to claim 4, wherein a Young's modulus of a material of the second region is higher than a Young's modulus of a material of the first region.

* * * * *